United States Patent
Li et al.

(10) Patent No.: US 6,959,054 B2
(45) Date of Patent: Oct. 25, 2005

(54) FILTER BANK AND RECEIVER FOR PROCESSING CONTINUOUS PHASE MODULATED SIGNALS

(75) Inventors: Yunxin Li, Ryde (AU); Xiaojing Huang, Waverton (AU)

(73) Assignee: Motorola, Inc., Schaumburg, IL (US)

( * ) Notice: Subject to any disclaimer, the term of this patent is extended or adjusted under 35 U.S.C. 154(b) by 782 days.

(21) Appl. No.: 10/005,778

(22) Filed: Nov. 8, 2001

(65) Prior Publication Data

US 2003/0099313 A1 May 29, 2003

(51) Int. Cl.[7] ............................................. H04L 27/06
(52) U.S. Cl. ..................... 375/343; 375/316; 375/340; 714/796
(58) Field of Search ......................... 375/343; 714/796, 714/795

(56) References Cited

U.S. PATENT DOCUMENTS 6,389,574 B1 * 5/2002 Belveze et al. ............. 714/795

OTHER PUBLICATIONS

Cyclic spectral analysis of continuous–phase modulated signals□□Napolitano, A.; Spooner, C.M.; Signal Processing, IEEE Transactions on [see also Acoustics, Speech, and Signal Processing, IEEE Transactions on, vol. 49 , Issue: 1, Jan. 2001 pp. 30–34.*

* cited by examiner

*Primary Examiner*—Stephen Chin
*Assistant Examiner*—Erin File

(57) ABSTRACT

A filter bank (10) and receiver including the filter bank (10) that is designed for processing a baseband signal of a received continuous phase modulated signal S(t) with an integer modulation index. The filter bank (10) has outputs for providing a plurality of decision variable values (d1,d2, d3,d4) each representing a likelihood value of a symbol, from a group of predefined symbols that are likely to be present in the continuous phase modulated signal S(t). The filter bank 10 has filter units (12,14,16,18) each having an impulse response determined by a complex main pulse containing a majority of signal energy of one of the predefined symbols that is likely to be in the continuous phase modulated signal S(t).

17 Claims, 2 Drawing Sheets

FILTER BANK AND RECEIVER FOR PROCESSING CONTINUOUS PHASE MODULATED SIGNALS

FIELD OF THE INVENTION

This invention relates to a filter bank and receiver for processing continuous phase modulated signals with an integer modulation index. The invention is particularly useful for filtering baseband signals of a received continuous phase modulated signal to provide likelihood values indicative of a particular symbol being present in the modulated signal.

BACKGROUND ART

Continuous Phase Modulation (CPM) is a known method for transmitting symbols (information) such as numbers, text messages and encoded voice messages in digital communications systems. A CPM signal is a modulated signal characterized by a phase shift function incorporated with a modulation index. In order to have smooth phase transition in the modulated signal's carrier and reduce spectral side lobes, a partial response CPM signal with phase shift function that has a non-constant duration larger than one symbol duration is often used. Ideally, a receiver for demodulating this partial response CPM signal includes a maximum-likelihood sequence detector implemented using a bank of matched-filters followed by a Viterbi processor. However, the receiver requires relatively large number of filters and trellis states resulting in undesirable computational demands.

Efforts have been made to reduce the complexity of receivers for demodulating CPM signals. One approach is based on the decomposition of a CPM signal into a sum of pulse amplitude modulated (PAM) pulses. It has been found that a significant reduction in the number of both matched-filters and trellis states can be achieved by using only a few main pulses to approximate the CPM signal. The conventional decomposition process is based on Laurent decomposition which is only valid for binary CPM signals with a non-integer modulation index. CMP signals with an integer modulation index can be treated as the product of two CPM signals with non-integer modulation indexes. However, because the decomposition of an integer into two non-integer values is not unique, different decomposition of the modulation index will lead to different expressions of the same CPM signal.

Another conventional method to demodulate CPM signals is by using a frequency discriminator associated with real and imaginary demodulators that provide a complex baseband signal S(t) with real and imaginary components. Typically, the frequency discriminator multiplies the baseband signal S(t) by a conjugated delayed version of the baseband signal S*(t−Δt) with time delay Δt to provide a processed signal S(t)·S*(t−Δt). The imaginary part of the processed signal S(t)·S*(t−Δt) is extracted to provide a decision variable that is processed, by a decision module, to provide a decision indicating what symbol was most likely modulated in the baseband signal S(t). From this decision, a symbol is provided at the output of the discriminator and thereafter further decisions provide further symbols as will be apparent to a person skilled in the art.

In a conventional frequency discriminator, the decision module assumes that there is a linear relationship between decision variable and the carrier phase difference. However, this relationship is actually sinusoidal. There is also inherent noise in the frequency discriminator that affects decision accuracy. Furthermore, decision accuracy may also be affected by center frequency drift and symbol timing that can lead to error propagation.

In this specification, including the claims, the terms 'comprises', 'comprising' or similar terms are intended to mean a non-exclusive inclusion, such that a method or apparatus that comprises a list of elements does not include those elements solely, but may well include other elements not listed.

SUMMARY OF THE INVENTION

According to one aspect of the invention there is provided a filter bank for processing a baseband signal of a received continuous phase modulated signal with an integer modulation index, the filter bank having filter bank outputs for providing a plurality of decision variable values each representing a likelihood value of a symbol, from a group of predefined symbols that are likely to be present in the continuous phase modulated signal, said filter bank having filter units each having an impulse response determined by a complex main pulse containing a majority of signal energy of one of the predefined symbols that is likely to be in the continuous phase modulated signal.

Suitably, said filter bank outputs are coupled to a decision module, wherein in use the decision module processes the decision variable values to provide a symbol at the output thereof, the symbol being one of the group of predefined symbols.

Preferably, the decision module in use provides the symbol for non-coherent demodulation based on a largest value of the decision variables.

Suitably, the decision module in use provides the symbol by effecting the calculation:

$$\left| \int_0^{LT} r(t+NT) S^*_{\alpha_N}(t) dt \right|$$

wherein r(t) is the baseband signal; $S_{\alpha_N}(t)$ is the complex main pulse associated with symbol $\alpha_N$ in the time interval [NT,(N+L)T]; T is the symbol interval; N is an integer time index; and L is the non-constant duration of the continuous phase modulated signal's phase shift function in symbols.

Preferably, the decision module in use provides the symbol for coherent demodulation based on estimated fading channel coefficients and a largest value of the decision variables.

Suitably, the decision module in use provides the symbol by effecting the calculation:

$$(-1)^{Nh} \mathrm{Re}\left[ C^*(NT) \int_0^{LT} r(t+NT) S^*_{\alpha_N}(t) dt \right]$$

wherein C(NT) is the channel coefficient at time NT; r(t) is the baseband signal; $S_{\alpha_N}(t)$ is the complex main pulse associated with symbol $\alpha_N$ in the time interval [NT,(N+L)T]; T is the symbol interval, N is integer time index; and L is the non-constant duration of the continuous phase modulated signal's phase shift function in symbols, and h is the modulation index.

Preferably, said filter bank is a matched filter bank.

Preferably, each of said filter units has an impulse response comprising a window function defined as:

$$\prod_{\substack{i=-L+1\\i\neq 0}}^{L-1}\frac{\sin M\varphi(t-iT)}{M\sin\varphi(t-iT)}$$

wherein M is the number of all possible symbols in the continuous phase modulated signal, T is the symbol interval, and $\phi(t)$ is the phase shift function.

Suitably, said impulse response is also based on a phase shift function $\alpha_N\phi(t)$.

Preferably, said impulse response is based upon the function:

$$\prod_{\substack{i=-L+1\\i\neq 0}}^{L-1}\frac{\sin M\varphi(t-iT)}{M\sin\varphi(t-iT)}\cdot e^{j\alpha_N\varphi(t)}.$$

According to another aspect of the invention there is provided a receiver for receiving a continuous phase modulated signal with an integer modulation index, the receiver comprising:

a filter bank for processing a baseband signal of the continuous phase modulated signal, the filter bank having filter bank outputs for providing a plurality of decision variable values each representing a likelihood value of a symbol, from a group of predefined symbols that are likely to be present in the continuous phase modulated signal, said filter bank having filter units each having an impulse response determined by a complex main pulse containing a majority of signal energy of one of the predefined symbols that is likely to be in the continuous phase modulated signal; and a decision module having inputs coupled to the filter bank outputs, wherein in use the decision module processes the decision variable values to provide a symbol at the output thereof, the symbol being one of the group of predefined symbols.

Suitably, the decision module and filter bank may have one or more of the above recited features or functions.

BRIEF DESCRIPTION OF THE DRAWINGS

In order that the invention may be readily understood and put into practical affect, reference will now be made to a preferred embodiment as illustrated with reference to the accompanying drawings in which.

DETAILED DESCRIPTION OF THE PREFERRED EMBODIMENTS OF THE INVENTION

Figure 1:
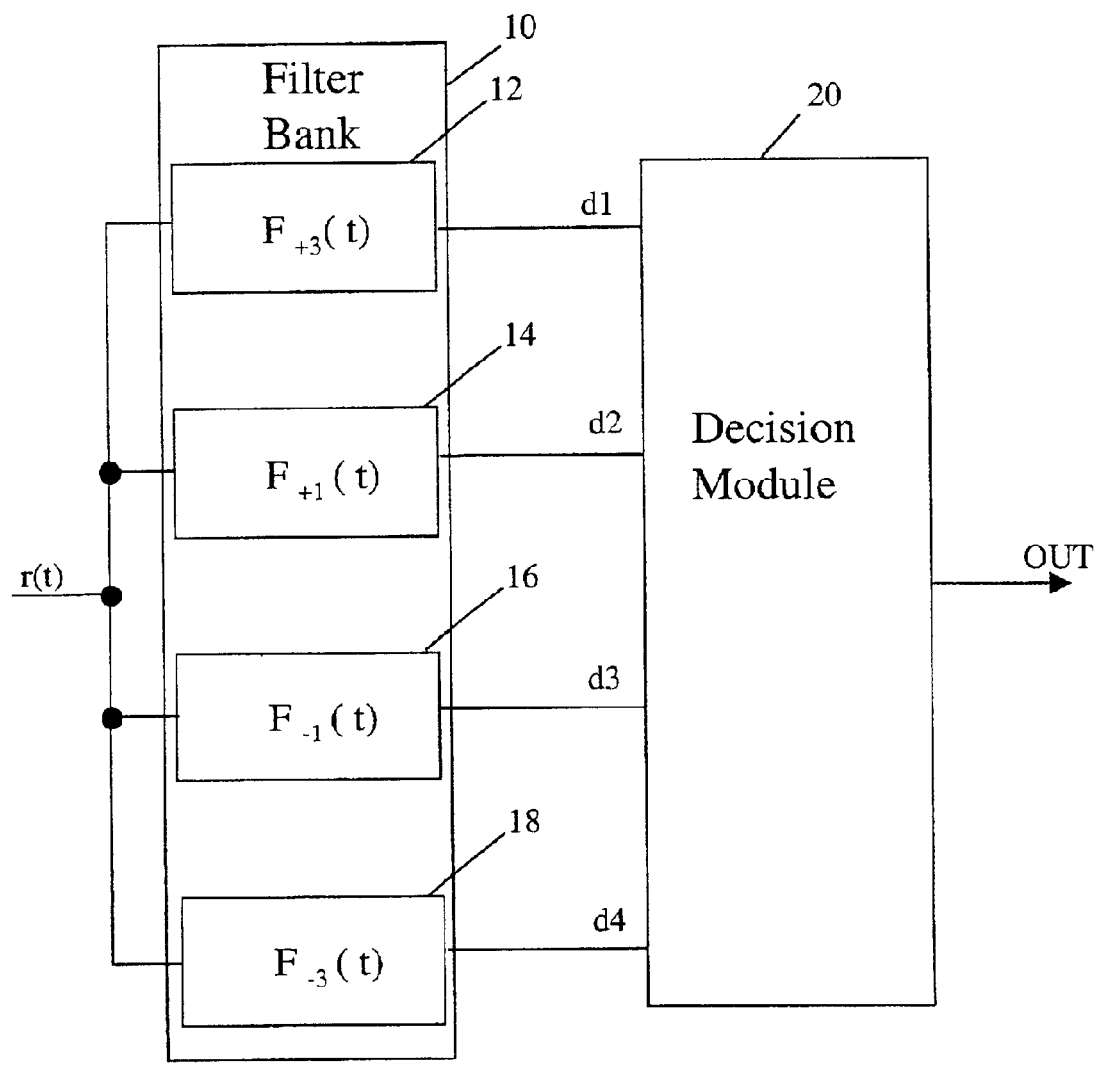
FIG. 1 illustrates a schematic block diagram of a filter bank with outputs coupled to a decision module in accordance with the invention.

When an M-ary CPM signal with an integer modulation index is decomposed into a series of Pulse Amplitude Modulated (PAM) pulses, it becomes apparent that the most significant part of signal energy is conveyed by: (i) a data independent periodic component; (ii) and data dependent M−1 PAM components associated with the first M−1 PAM pulses of the longest pulse duration.

As in known in the art, an M-ary CPM signal S(t) with an integer modulation index may be characterized by:

$$S(t)=\exp\left\{j\sum_{n=-\infty}^{\infty}a_n\varphi(t-nT)\right\},\quad (1)$$

where: $\alpha_n\in\{\pm 1,\pm 3,\ldots,\pm(M-1)\}$ represents each of the M-ary symbols (of data or information) that form a group of predefined symbols that are likely to be present in the M-ary continuous phase modulated signal S(t) (M symbols in total); T is a symbol interval of a symbol $\alpha_n$; $\phi(t)$ is the phase shift function which is assumed to be zero for negative value of time and $h\pi$ for time greater than L symbol intervals (L≧1); and h denotes the integer modulation index.

It is well known that M is an integer power of 2 (i.e., $M=2^P$ where P is any positive integer). Thus an M-ary symbol $\alpha_n$ can be represented in radix-2 form as:

$$a_n=\sum_{l=0}^{P-1}a_n^{(l)}2^l,\quad (2)$$

where $\alpha_n^{(l)}\in\{+1,-1\}$ are binary bits associated with symbol $\alpha_n$.

As will be apparent to a person skilled in the art, the CPM signal characterized above is non linear with respect to the symbol $\alpha_n$. To obtain a linear function of the CPM signal, the signal can be decomposed into the: (i) data independent periodic component; (ii) and data dependent M−1 PAM components.

The data independent periodic component is characterized as follows:

$$\sum_{n=-\infty}^{\infty}(-1)^{nh}h_0(t-nT).\quad (3)$$

Furthermore, the data dependent M−1 PAM components are characterized as follows:

$$\sum_{n=-\infty}^{\infty}(-1)^{nh}\sum_{k=1}^{M-1}a_{k,n}h_k(t-nT).\quad (4)$$

Referring to equation -(3), $h_0(t)$ is one period of the data independent periodic component if the modulation index h is even. Alternatively, $h_0(t)$ is half a period of the data independent periodic component if the modulation index h is odd. Accordingly, $h_0(t)$ can be expressed by the following equation:

$$h_0(t)=\prod_{i=-L+1}^{0}\frac{\sin M\varphi(t-iT)}{M\sin\varphi(t-iT)},\ 0\leq t\leq T.\quad (5)$$

Referring to equation -(4), $h_k(t)$ is a PAM pulse for each of the data dependent M−1 PAM components and is expressed by the following equation:

$$h_k(t)=\prod_{\substack{i=-L+1\\i\neq 0}}^{L-1}\frac{\sin M\varphi(t-iT)}{M\sin\varphi(t-iT)}\prod_{l=0}^{P-1}\quad (6)$$

$$[\gamma_{k,l}\sin 2^l\varphi(t)+(1-\gamma_{k,l})\cos 2^l\varphi(t)],\ 0\leq t\leq LT.$$

The coefficients $\alpha_{k,n}$ in equation -(4) are related to the binary bits $\alpha_n^{(l)}$ by:

$$a_{k,n} = \prod_{l=0}^{P-1} (\gamma_{k,l} j a_n^{(l)} + 1 - \gamma_{k,l}), \quad (7)$$

where $\gamma_{k,l}$ is the lth digit (0 or 1) in the radix-2 representation of the integer k, the integer k being expressed by:

$$k = \sum_{l=0}^{P-1} 2^l \gamma_{k,l}, \quad 1 \le k \le M-1. \quad (8)$$

From the above it is apparent that all pulses for $h_0(t)$ and $h_k(t)$ can be determined by the phase shift function $\phi(t)$ and M. Accordingly, it is possible to construct a filter bank for processing a received CPM signal in order to provide a plurality of decision variables d1 to dM. The decision variables d1 to dM each represent a likelihood value of a symbol $\alpha_n$, from the group of predefined symbols that are likely to be present in the M-ary continuous phase modulated signal S(t).

The resulting filter bank should comprise filter modules each providing one of the decision variables d1 to dM. To design each of the filter modules, the main signal component associated with symbol $\alpha_N$ in the time interval [NT,(N+L)T] must be determined, which is defined as an ensemble-averaged waveform over all symbols that are likely to be present in the M-ary continuous phase modulated signal other than $\alpha_N$. The main signal component for the symbol $\alpha_N$ is therefore derived from:

$$\tilde{S}(t) = E_{\ldots a_{N-1}, a_{N+1}, \ldots}[S(t)] \quad (9)$$

$$= E_{\ldots, a_{N-1}^{(0)}, a_{N-1}^{(1)}, \ldots, a_{N-1}^{(P-1)}, a_{N+1}^{(0)}, a_{N+1}^{(1)}, \ldots, a_{N+1}^{(P-1)}, \ldots}[S(t)]$$

$$= \sum_{n=N}^{N+L-1} (-1)^{nh} h_0(t-nT) + (-1)^{Nh} \sum_{k=1}^{M-1} a_{k,N} h_k(t-NT)$$

$$= (-1)^{Nh} S_{\alpha_N}(t-NT), \, NT \le t \le (N+L)T$$

where $$S_{\alpha_N}(t) = \sum_{n=0}^{L-1} (-1)^{nh} h_0(t-nT) + \sum_{k=1}^{M-1} a_{k,N} h_k(t) \quad (10)$$

$$= \prod_{\substack{i=-L+1 \\ i \ne 0}}^{L-1} \frac{\sin M \varphi(t-iT)}{M \sin \varphi(t-iT)} \cdot e^{j\alpha_N \varphi(t)}, \, 0 \le t \le LT.$$

Equation -(10) describes a complex waveform with a data-independent component that is a segment of the periodic component in the time interval [0, LT] and a data-dependent component that is the superposition of the first M-1 PAM pulses associated with $h_k(t)$, $1 \le k \le M-1$. We call $S_{\alpha_N}(t)$ the complex main pulse which can be also interpreted as a 'windowed' complex exponential with window function $$\prod_{\substack{l=-L+1 \\ i \ne 0}}^{L-1} \frac{\sin M \varphi(t-iT)}{M \sin \varphi(t-iT)}$$

and phase shift function $\alpha_N \phi(t)$.

From analysis of equation -(9) the main signal component for the symbol $\alpha_N$ is a delayed version of complex main pulse $S_{\alpha_N}(t)$ that is multiplied by a phase state $(-1)^{Nh}$ of the signal S(t). The complex main pulse $S_{\alpha_N}(t)$ contains signal energy $ES\alpha_N$. The signal energy $ES\alpha_N$ for a symbol $\alpha_N$ can be calculated by determining an amplitude of the complex main pulse $S_{\alpha_N}(t)$ by the following equation:

$$ES_{\alpha_N} = \int_0^{LT} S_{\alpha_N}(t) S_{\alpha_N}^*(t) dt \quad (11)$$

Once the signal energy for a symbol $\alpha_N$ is calculated from equation -(11), a majority signal energy value is determined that is typically more than 90% of the total signal energy per symbol. The matched-filter for providing decision variable associated with symbol $\alpha_N$ can therefore be matched to the complex main pulse $S_{\alpha_N}(t)$.

From the above, a filter bank can be designed. In FIG. 1, there is illustrated an example of a filter bank 10 for processing a received M-ary CPM signal with integer modulation index (M=4 in this example). The filter bank 10 is designed to provide a plurality of decision variables d1,d2,d3,d4 each representing a likelihood value of a symbol, from a group of predefined symbols, being present in a digitized baseband signal of a received CPM signal. In the example of the filter bank 10, the group of symbols comprises four numbers being +(M-1), +1, -1, -(M-1) that are associated respectively with the decision variables d1,d2, d3,d4. Since M=4, the filter 10 comprises 4 filter units 12,14,16,18 one for each of the symbols that are numbers in the set {+(M-1),+1,-1,-(M-1)}. Each of the filter units 12,14,16,18 is designed to provide respectively one of the decision variables d1,d2,d3,d4 and has impulse response determined by the complex main pulse, i.e., $F_{\alpha_N}(t)=S^*_{\alpha_N}(-t)$, for $\alpha_N$=+(M-1),+1,-1, and -(M-1). Thus, using equation -(10) then filter unit 12 is defined as:

$$F_{+3}(t) = S^*_{+3}(-t) = \prod_{\substack{i=-L+1 \\ i \ne 0}}^{L-1} \frac{\sin M \varphi(-t-iT)}{M \sin \varphi(-t-iT)} \cdot e^{-j3\varphi(-t)}; \quad (12)$$

filter unit 14 is defined as:

$$F_{+1}(t) = S^*_{+1}(-t) = \prod_{\substack{i=-L+1 \\ i \ne 0}}^{L-1} \frac{\sin M \varphi(-t-iT)}{M \sin \varphi(-t-iT)} \cdot e^{-j\varphi(-t)}; \quad (13)$$

filter unit 16 is defined as:

$$F_{-1}(t) = S^*_{-1}(-t) = \prod_{\substack{i=-L+1 \\ i \ne 0}}^{L-1} \frac{\sin M \varphi(-t-iT)}{M \sin \varphi(-t-iT)} \cdot e^{j\varphi(-t)}; \quad (14)$$

and filter unit 16 is defined as:

$$F_{-3}(t) = S^*_{-3}(-t) = \prod_{\substack{i=-L+1 \\ i \ne 0}}^{L-1} \frac{\sin M \varphi(-t-iT)}{M \sin \varphi(-t-iT)} \cdot e^{j3\varphi(-t)}. \quad (15)$$

In FIG. 1, there is also illustrated a decision module 20 with inputs coupled to outputs of the filter bank 10 to thereby provide the decision variables d1,d2,d3,d4 to decision module 20. An output OUT of the decision module 20 provides a stream of output symbols based on received values of the decisions variables d1,d2,d3,d4 as will be apparent to a person skilled in the art. The decision module 20 is designed on the assumption that a CPM signal S(t) with an integer modulation index is transmitted through an Addative White Gaussian Noise (AWGN) and flat fading channel that is received at a receiver comprising the filter bank 10. In practice, a received signal r(t) applied to the filter bank 10 can be expressed as:

$$r(t)=C(t)\cdot S(t)+n(t), \quad (16)$$

where C(t) is a complex time-varying coefficient representing the unknown carrier phase and the fading waveform, n(t) is a zero-mean complex Gaussian noise with double-sided power spectral density $N_0$.

For coherent demodulation of the received CPM signal, the decision variables at time NT are calculated as:

$$(-1)^{Nh} \text{Re}\left[ C^*(NT) \int_0^{LT} r(t+NT) S^*_{\alpha_N}(t) dt \right], \quad (17)$$

wherein C(NT) is the channel coefficient at time NT; r(t) is the baseband signal; $S_{\alpha_N}(t)$ is the complex main pulse associated with symbol $\alpha_N$ in the time interval [NT,(N+L)T]; T is the symbol interval, N is integer time index; and L is the non-constant duration of the continuous phase modulated signal's phase shift function in symbols, and h is the modulation index.

From equation -(17), the decision module 20 can be designed to estimate fading channel coefficients. The output symbol at the output OUT of the decision module 20 is based on the estimated estimate fading channel coefficients and a largest value of one of the decision variables calculated using equation -(17).

For non-coherent demodulation of the received CPM signal, the decision variables are calculated from the equation:

$$\left| \int_0^{LT} r(t+NT) S^*_{\alpha_N}(t) dt \right|. \quad (18)$$

wherein r(t) is the baseband signal; $S_{\alpha_N}(t)$ is the complex main pulse associated with symbol $\alpha_N$ in the time interval [NT,(N+L)T]; T is the symbol interval; N is an integer time index; and L is the non-constant duration of the continuous phase modulated signal's phase shift function in symbols.

Again the output symbol at the output OUT is simply decided according to the largest value among the decision variables calculated using equation -(18).

Figure 2:
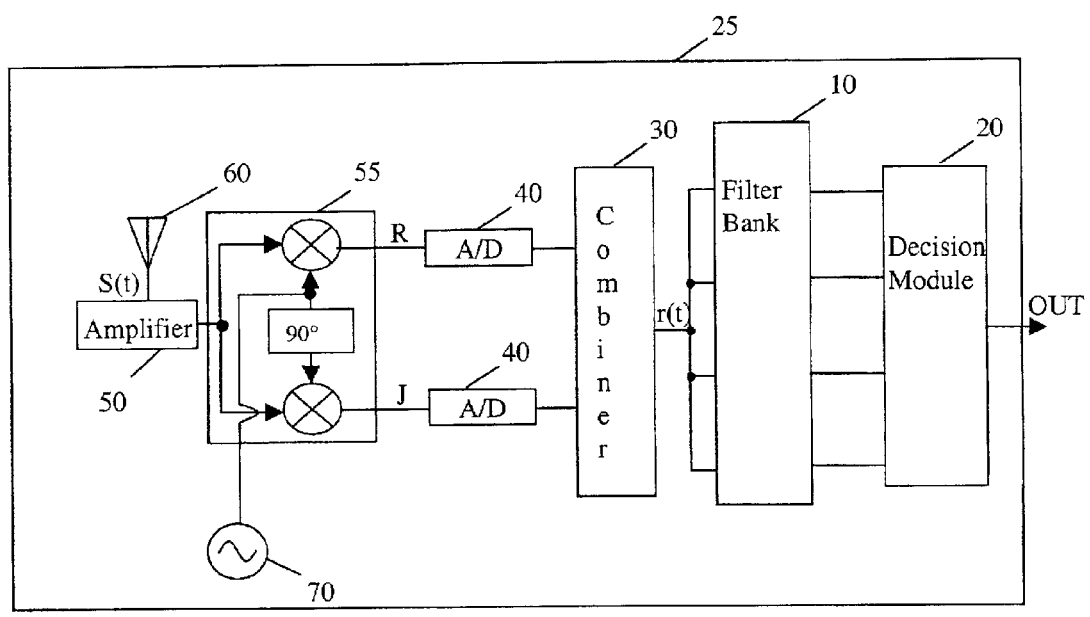
FIG. 2. illustrates a schematic block diagram of a receiver including the filter bank and decision module of FIG. 1.

Referring to FIG. 2, there is illustrated a schematic block diagram of a receiver 25 including the filter bank 10 and decision module 20. The receiver 25 includes an antenna 60 coupled to an input of a low noise amplifier 50. An output of the amplifier 50 is coupled to an input of a demodulator module 55 that also has an input coupled to a signal generator 70 that supplies a demodulation carrier frequency. There are two outputs from the demodulator module 55, these outputs being real and imaginary outputs that are coupled to inputs of analog to digital converters 40. Outputs of the analog to digital converters 40 are coupled to inputs of combiner 30 that has an output coupled to the filter bank 10 that is coupled to the decision module 20.

In use, a received signal S(t) is received by antenna 60. This signal S(t) is amplified by amplifier 50 and after the signal S(t) is processed by the demodulator 55 to provide In-phase and Quadrature baseband signals, the analog to digital converters 40 digitizes these signals which are combined by the combiner 30. The combiner 30 provides a received digitized baseband signal r(t) of the continuous phase modulated signal S(t) with an integer modulation index to the filter bank 10. The filter bank 10 then provides four decision variable values for decision variables d1,d2,d3,d4 to the decision module 20. The decision variable values for decision variables d1,d2,d3,d4 are likelihood values of which symbol was most likely received in the CPM signal S(t), these values are processed by the decision module 20 which provides a symbol at the output OUT, the symbol being one of the group of predefined symbols +(M−1), +1, −1, −(M−1).

Advantageously, S(t) always contains a data-independent periodic component characterized by the pulse $h_0(t)$. This unique feature can be exploited to estimate the channel coefficient C(t), resulting in the following iterative equation:

$$C(NT) = \lambda C[(N-1)T] + (1-\lambda)(-1)^{Nh} \frac{\int_0^T r(t+NT) h_0(t) dt}{\int_0^T h_0^2(t) dt}, \quad (19)$$

where $0<\lambda<1$ is a real factor chosen according to how fast the channel is fading.

This invention presents a solution for decomposing an M-ary CPM signal with any integer modulation index. The expressions of a data-independent periodic component and M−1 data-dependent PAM components associated with the first M−1 PAM pulses of the longest pulse duration in the modulated signal are given in general forms. A simplified matched-filter demodulation scheme is also constructed, which offers performance close to that of a high quality receiver. The filter units in the filter bank of this demodulation scheme are matched to the complex main pulses which reflect the main signal components and the data-independent periodic component can be used for channel estimation.

The detailed description provides preferred exemplary embodiments only, and is not intended to limit the scope, applicability, or configuration of the invention. Rather, the detailed description of the preferred exemplary embodiments provide those skilled in the art with an enabling description for implementing preferred exemplary embodiments of the invention. It should be understood that various changes may be made in the function and arrangement of elements without departing from the spirit and scope of the invention as set forth in the appended claims.

We claim:

1. A filter bank for processing a baseband signal of a received continuous phase modulated signal with an integer modulation index, the filter bank having filter bank outputs coupled to a decision module, said filter bank outputs providing a plurality of decision variable values each representing a likelihood value of a symbol, from a group of predefined symbols that are likely to be present in the continuous phase modulated signal, said filter bank having filter units each having an impulse response determined by a complex main pulse containing a majority of signal energy of one of the predefined symbols that is likely to be in the continuous phase modulated signal, and wherein in use the decision module processes the decision variable values to provide a symbol at the output thereof, the symbol being one of the group of predefined symbols.

2. A filter bank as claimed in claim 1, and wherein the decision module in use provides the symbol for non-coherent demodulation based on a largest value of the decision variables.

3. A filter bank as claimed in claim 2, wherein the decision module in use provides the symbol by effecting the calculation:

$$\left| \int_0^{LT} r(t+NT) S^*_{\alpha_N}(t) dt \right|$$

wherein r(t) is the baseband signal; $S_{\alpha_N}(t)$ is the complex conjugate of the main pulse associated with symbol $\alpha_N$ in the time interval [NT,(N+L)T]; T is the symbol interval; N is an integer time index; and L is the non-constant duration of the continuous phase modulated signal's phase shift function in symbols.

4. A filter bank as claimed in claim 1, wherein the decision module in use provides the symbol for coherent demodulation based on estimated fading channel coefficients and a largest value of the decision variables.

5. A filter bank as claimed in claim 4, wherein the decision module in use provides the symbol by effecting the calculation:

$$(-1)^{Nh}\mathrm{Re}\left[C^*(NT)\int_0^{LT} r(t+NT)S^*_{a_N}(t)\,dt\right]$$

wherein C(NT) is the channel coefficient at time NT; r(t) is the baseband signal; $S_{a_N}(t)$ is the complex conjugate of the main pulse associated with symbol $\alpha_N$ in the time interval [NT,(N+L)T]; T is the symbol interval, N is integer time index; and L is the non-constant duration of the continuous phase modulated signal's phase shift function in symbols, and h is the modulation index.

6. A filter bank as claimed in claim 1, wherein said filter bank is a matched filter bank.

7. A filter bank as claimed in claim 1, wherein each of said filter units has an impulse response comprising a window function defined as:

$$\prod_{\substack{i=-L+1 \\ i\neq 0}}^{L-1} \frac{\sin M\varphi(t-iT)}{M\sin\varphi(t-iT)}$$

wherein M is the number of all possible symbols in the continuous phase modulated signal, T is the symbol interval, L is the number of symbol intervals and $\phi(t)$ is the phase shift function.

8. A filter bank as claimed in claim 7, wherein, said impulse response is also based on a phase shift function $a_{N\phi}(t)$ where $a_N(t)=+(M-1), +1, -1, -(M-1)$.

9. A filter bank as claimed in claim 8, wherein said impulse response is based upon the function:

$$\prod_{\substack{i=-L+1 \\ i\neq 0}}^{L-1} \frac{\sin M\varphi(t-iT)}{M\sin\varphi(t-iT)} \cdot e^{ja_N\varphi(t)}.$$

10. A receiver for receiving a continuous phase modulated signal with an integer modulation index, the receiver comprising:
a filter bank for processing a baseband signal of the continuous phase modulated signal, the filter bank having filter bank outputs for providing a plurality of decision variable values each representing a likelihood value of a symbol, from a group of predefined symbols that are likely to be present in the continuous phase modulated signal, said filter bank having filter units each having an impulse response determined by a complex main pulse containing a majority of signal energy of one of the predefined symbols that is likely to be in the continuous phase modulated signal; and
a decision module having inputs coupled to the filter bank outputs, wherein in use the decision module processes the decision variable values to provide a symbol at the output thereof, the symbol being one of the group of predefined symbols, and wherein the decision module provides the symbol for non-coherent demodulation based on a largest value of the decision variables.

11. A receiver as claimed in claim 10, wherein the decision module in use provides the symbol by effecting the calculation:

$$\left|\int_0^{LT} r(t+NT)S^*_{a_N}(t)\,dt\right|$$

wherein r(t) is the baseband signal; $S_{a_N}(t)$ is the complex conjugate of the main pulse associated with symbol $\alpha_N$ in the time interval [NT,(N+L)T]; T is the symbol interval; N is an integer time index; and L is the non-constant duration of the continuous phase modulated signal's phase shift function in symbols.

12. A receiver as claimed in claim 10, wherein the decision module in use provides the symbol for coherent demodulation based on estimated fading channel coefficients and a largest value of the decision variables.

13. A receiver as claimed in claim 12, wherein the decision module in use provides the symbol by effecting the calculation:

$$(-1)^{Nh}\mathrm{Re}\left[C^*(NT)\int_0^{LT} r(t+NT)S^*_{a_N}(t)\,dt\right]$$

wherein C(NT) is the channel coefficient at time NT; r(t) is the baseband signal; $S_{a_N}(t)$ is the complex conjugate of the main pulse associated with symbol $\alpha_N$ in the time interval [NT,(N+L)T]; T is the symbol interval, N is integer time index; and L is the non-constant duration of the continuous phase modulated signal's phase shift function in symbols, and h is the modulation index.

14. A receiver as claimed in claim 10, wherein said filter bank is a matched filter bank.

15. A receiver as claimed in claim 10, wherein each of said filter units has an impulse response comprising a window function defined as:

$$\prod_{\substack{i=-L+1 \\ i\neq 0}}^{L-1} \frac{\sin M\varphi(t-iT)}{M\sin\varphi(t-iT)}$$

wherein M is the number of all possible symbols in the continuous phase modulated signal, T is the symbol interval, L is the number of symbol intervals and $\phi(t)$ is the phase shift function.

16. A filter bank as claimed in claim 15, wherein, said impulse response is also based on a phase shift function $a_{N\phi}(t)$ where $a_N(t)=+(M-1), +1, -1, -(M-1)$.

17. A filter bank as claimed in claim 16, wherein said impulse response is based upon the function:

$$\prod_{\substack{i=-L+1 \\ i\neq 0}}^{L-1} \frac{\sin M\varphi(t-iT)}{M\sin\varphi(t-iT)} \cdot e^{ja_N\varphi(t)}.$$

* * * * *